(12) United States Patent
Yokoyama et al.

(10) Patent No.: US 7,528,659 B2
(45) Date of Patent: May 5, 2009

(54) FULLY DIFFERENTIAL AMPLIFICATION DEVICE

(75) Inventors: Akio Yokoyama, Osaka (JP); Makoto Ikuma, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/963,944

(22) Filed: Dec. 24, 2007

(65) Prior Publication Data

US 2008/0157873 A1 Jul. 3, 2008

(30) Foreign Application Priority Data

Dec. 28, 2006 (JP) ............................. 2006-355861

(51) Int. Cl.
*H03F 3/45* (2006.01)
(52) U.S. Cl. ...................... 330/258; 330/260; 330/69
(58) Field of Classification Search ................ 330/258, 330/257, 260, 261, 253, 69
See application file for complete search history.

(56) References Cited

U.S. PATENT DOCUMENTS

| 6,400,219 B1 * | 6/2002 | Fayed ............................. 330/9 |
| 6,774,722 B2 * | 8/2004 | Hogervorst ................. 330/258 |
| 7,053,712 B2 * | 5/2006 | Bonaccio et al. ............ 330/258 |
| 7,453,319 B2 * | 11/2008 | Gupta et al. ................. 330/258 |

FOREIGN PATENT DOCUMENTS

JP   2000-323940   11/2000

* cited by examiner

*Primary Examiner*—Henry K Choe
(74) *Attorney, Agent, or Firm*—Dickinson Wright, PLLC

(57) ABSTRACT

An auxiliary current source is provided that includes MOS transistors feeding startup auxiliary current to the input portion of an output common mode voltage generation circuit amplifying the output of a differential amplifier and generating an output common voltage, and a correction current source is provided that includes MOS transistors feeding correction current corresponding to the auxiliary current to a common mode feedback comparator. Thereby, a control loop that controls the output common voltage to a predetermined voltage even when the input of the differential amplifier is outside the dynamic range at the beginning is correctly started up, thereby stabilizing the output common voltage at a desired voltage.

8 Claims, 10 Drawing Sheets

FULLY DIFFERENTIAL AMPLIFICATION DEVICE

BACKGROUND OF THE INVENTION

1. Field of the Invention

The present invention relates to a fully differential amplification device that has a common mode feedback circuit and is capable of improving the stability of the initial operation.

2. Prior Art

In recent years, in communication circuits, mixed signal circuits and the like, a fully differential amplification device that has two terminals for each of input and output and is completely symmetrical in circuit arrangement has been more frequently used from the viewpoint of removing high frequency noise and digital noise from the power source, the ground (GND) and the like. The fully differential amplification device in which the DC voltage (common voltage) of the output is not readily determined requires common mode feedback.

FIG. 5 shows an example of the structure of a conventional fully differential amplification device. In a differential amplifier 3, a positive input signal Vinp is inputted to a positive input terminal 1, and a negative input signal Vinn is inputted to a negative input terminal 2. The differential amplifier 3 generates a positive output signal Voutp1 and a negative output signal Voutn1 from a positive output terminal 21 and a negative output terminal 22, respectively. The positive output signal Voutp1 and the negative output signal Voutn1 of the differential amplifier 3 are inputted to a common voltage generation circuit 4.

The common voltage generation circuit 4 generates the output common voltage of the differential amplifier 3 based on the positive output signal Voutp1 and the negative output signal Voutn1 of the differential amplifier (operational amplifier) 3. An output common voltage 41 of the differential amplifier 3 which is the output of the common voltage generation circuit 4 is inputted to an inverting input terminal of a common mode feedback comparator 7. A reference voltage 5 is inputted to a noninverting input terminal of the common mode feedback comparator 7. Reference numeral 6 represents the ground (GND).

The common mode feedback comparator 7 compares the output common voltage 41 of the differential amplifier 3 with the reference voltage 5, and feeds back a common mode feedback signal 8 representative of the result of the comparison, to a common mode feedback terminal 44 of the differential amplifier 3 to thereby cause the differential amplifier 3 to operate so that the output common voltage 41 of the differential amplifier 3 coincides with the reference voltage 5.

FIG. 6 shows a concrete example of the circuit of the fully differential amplification device having common mode feedback. In FIG. 6, the positive input signal Vinp is inputted from the positive input terminal 1, and the negative input signal Vinn is inputted to the negative input terminal 2.

The differential amplifier 3 includes: MOS transistors M1 and M2 constituting a differential transistor pair; a MOS transistor M3 serving as a common current source that feeds a differential amplification current to the MOS transistors M1 and M2; and MOS transistors M4 and M5 constituting load current sources that individually feeds current to the MOS transistors M1 and M2. The positive input terminal 1 is connected to the gate of the MOS transistor M1, and the negative input terminal 2 is connected to the gate of the MOS transistor M2. The sources of the MOS transistors M1 and M2 are commonly connected, and connected to the drain of the MOS transistor M3. The source of the MOS transistor M3 is connected to the ground 6. The drains of the MOS transistors M1 and M2 are connected to the drains of the MOS transistors M4 and M5, respectively. The sources of the MOS transistors M4 and M5 are connected to the power source 12, and the gates thereof are commonly connected.

The positive input signal Vinp and the negative input signal Vinn are amplified by the differential amplifier 3 having the above-described structure, and the positive output signal Voutp1 and the negative output signal Voutn1 are outputted from the positive output terminal 21 and the negative output terminal 22 provided at the drains of the MOS transistors M2 and M1, respectively, The positive output signal Voutp1 and the negative output signal Voutn1 outputted from the differential amplifier 3 are inputted to the output common voltage generation circuit 4.

The output common voltage generation circuit 4 includes inversion amplification MOS transistors M10 and M11, MOS transistors M8 and M9 serving as the current source, and voltage arithmetic averaging resistors R1 and R2. The drains of the MOS transistors M10 and M11 are connected to the drains of the MOS transistors M8 and M9, respectively. The sources of the MOS transistors M8 and M9 are connected to the ground 6. The sources of the MOS transistors M10 and M11 are connected to the power source 12. A series circuit of the resistors R1 and R2 are connected between the drains of the MOS transistors M10 and M11, and the connecting point of the resistors R1 and R2 is the output terminal of the output common voltage generation circuit 4 for outputting the output common voltage 41. A positive output terminal 42 and a negative output terminal 43 are provided at the drains of the MOS transistors M10 and M11. A positive amplification output signal Voutp which is the positive output signal Voutp1 inversion-amplified by the MOS transistor M11 is outputted from the positive output terminal 42. A negative amplification output signal Voutn which is the negative output signal. Voutn1 inversion-amplified by the MOS transistor M11 is outputted from the negative output terminal 43.

When the positive output signal Voutp1 and the negative output signal Voutn1 outputted from the differential amplifier 3 are inputted to the output common voltage generation circuit 4 having the above-described structure, the positive output signal Voutp1 and the negative output signal Voutn1 are inversion-amplified by the MOS transistors M10 and M11, and at the same time, arithmetically averaged by the resistors R1 and R2, whereby the output common voltage 41 is generated. The output common voltage 41 is inputted to the common mode feedback comparator 7, the output common voltage 41 is compared with the reference voltage 5, and the common mode feedback signal 8 which is the comparison result signal is fed back to the differential amplifier 3.

The common mode feedback comparator 7 includes: MOS transistors M14 and M15 constituting a comparison transistor pair; a MOS transistor M13 serving as the current source that feeds a comparison current to the MOS transistors M14 and M15; and MOS transistors M16 and M17 serving as the load on the MOS transistors M14 and M15. The sources of the MOS transistors M14 and M15 are commonly connected, and connected to the drain of the MOS transistor M13. The source of the MOS transistor M13 is connected to the ground 6. The drains of the MOS transistors M14 and M15 are connected to the drains of the MOS transistors M16 and M17. The sources of the MOS transistors M16 and M17 are connected to the power source 12, and the gates thereof are connected to the drains thereof, respectively. The drain (gate) of the MOS transistor M16 serves as the output terminal for the common mode feedback signal 8, and is connected to the common gate of the MOS transistors M4 and M5 of the differential amplifier 3. The MOS transistor M16 and the MOS transistors M4 and M5 constitute a current mirror circuit. The output common voltage 41 is inputted to the gate of the MOS transistor M14, and the reference voltage 5 is inputted to the gate of the MOS transistor M15.

The output common voltage 41 is compared with the reference voltage 5 by the common mode feedback comparator 7 having the above-described structure.

When the output common voltage 41 is higher than the reference voltage 5, the current of the MOS transistor M13 flows through the MOS transistors M14 and M16, the drain voltage of the MOS transistor M16 decreases, and the gate voltage of the MOS transistor M16 decreases. Consequently, the gate voltages of the MOS transistors M4 and M5 which are the load current source of the differential amplifier 3 decrease to increase the source-gate voltages of the MOS transistors M4 and M5. Thereby, the currents of the MOS transistors M4 and M5 increase, and the drain voltages of the MOS transistors M4 and M5 increase. For this reason, the gate voltages of the MOS transistors M10 and M11 increase, the currents of the MOS transistors M10 and M11 decrease, and the drain voltages of the MOS transistors M10 and M11 decrease. Consequently, the output common voltage 41 decreases.

When the output common voltage 41 is lower than the reference voltage 5, since the current of the MOS transistor M13 flows through the MOS transistors M15 and M17, the drain voltage of the MOS transistor M16 increases, and the gate voltage of the MOS transistor M16 increases. Consequently, the gate voltages of the MOS transistors M4 and M5 increase to decrease the source-gate voltages of the MOS transistors M4 and M5. Thereby, the currents of the MOS transistors M4 and M5 decrease, and the drain voltages of the MOS transistors M4 and M5 decrease. For this reason, the gate voltages of the MOS transistors M10 and M11 decrease, the drain currents of the MOS transistors M10 and M11 increase, and the drain voltages of the MOS transistors M10 and M11 increase. Consequently, the output common voltage 41 increases.

After all, feedback is made so that the output common voltage 41 is the same as the reference voltage 5, so that the output common voltage 41 becomes the same as the reference voltage 5.

A current source circuit 10 includes a current source 11 and a MOS transistor M18. The current source 11 has one end connected to the power source 12 and its other end connected to the drain and gate of the MOS transistor M18. The source of the MOS transistor M18 is connected to the ground 6. The MOS transistor M18, together with the MOS transistors M3, M8, M9 and M13, constitutes a current mirror circuit. As described above, the MOS transistor M3 constitutes the current source of the differential amplifier 3 including the MOS transistors M1 and M2, the MOS transistors M8 and M9 constitute the current source of the inversion amplification MOS transistors M10 and M11, and the MOS transistor M13 constitutes the current source of the common mode feedback comparator 7.

There is a problem in that at the startup of the power source, at the time of switching of the mode (for example, at the time of switching of the levels of the input signal) and the like, the output voltage of the differential amplifier 3 is frequently fixed not at the desired reference voltage but at a different voltage such as the ground (GND) or the power supply voltage (VDD).

FIG. 8 shows the circuit of an amplifier using an operational amplifier, or a high-pass filter in which such a problem readily occurs in FIG. 8, reference numerals 31 and 32 represent capacitors, and reference numerals 33 to 36 represent resistors. When the capacitance of the capacitors 31 and 32 is C1, the resistance value of the resistors 33 and 34 is R3, and the resistance value of the resistors 35 and 36 is R4 in FIG. 8, the transfer function H(s) of the input and output is $H(s)=R4/R3*\{s/(s+1/(C1*R3))\}$ (Here, s=jω), so that a high-pass filter is constituted in which the gain of the passband is R4/R3 and the cutoff angular frequency is ωc=1/(C1*R3). For this reason, no DC voltage is transmitted. Therefore, it is necessary for the input DC voltage to be supplied by the output common voltage.

At that time, if the stabilization point of the common voltage is at a voltage other than the desired common voltage, for example, the ground (GND), the stabilization point of the common voltage is fixed at that voltage, so that amplification cannot be performed.

As another example, an inverting amplifier including resistors and an operational amplifier is shown in FIG. 9. In FIG. 9, reference numerals 33 to 36 represent resistors. When the resistance value of the resistors 33 and 34 is R3 and the resistance value of the resistors 35 and 36 is R4 in FIG. 9, an inverting amplifier with a gain R4/R3 is constituted. When the input DC voltage is VIN and the output DC voltage is VO, the input terminal DC voltage V1 of the operational amplifier is $V1=VIN*R4/(R3+R4)+VO*R3/(R3+R4)$.

Therefore, when the output of the inverting amplifier is other than the desired common voltage and the DC voltage V1 is outside the input dynamic range of the operational amplifier, the operating point is shifted, so that there are cases where amplification cannot be performed. In addition, when the input DC voltage VIN transitionally becomes the ground GND or the power supply voltage VDD at the time of switching of the mode and the like and the resistively divided voltage V1 is outside the input dynamic range, the input and output voltages of the operational amplifier are fixed at other than the desired operating point, so that normal amplification cannot be performed.

FIG. 10 shows a current/voltage conversion circuit using an operational amplifier. The input of this current/voltage conversion circuit is current sources 13 and 14, and by the currents of the current sources 13 and 14 flowing through the resistors 35 and 36, the voltage outputs 21 and 22 are taken out. When the common voltage of the reference voltage 5 is VCOM, Voutn=VCOM−Iinp*R4. When Iinp=0, the input and output voltages of the operational amplifier are VCOM, and in this case, if the common voltage is not correctly supplied, normal amplification cannot be performed, either.

For this reason, for example, when the input voltage is outside the dynamic range of the differential amplifier 3, a second comparator is provided, and auxiliary current is fed until the output voltage is within the dynamic range (see Japanese Unexamined Patent Application Publication No. 2000-323940).

FIG. 7 shows a concrete example thereof. In FIG. 7, reference numeral 100 represents the above-mentioned second comparator. The comparator 100 includes comparison MOS transistors M21 to M24 and a MOS transistor M20 serving as the current source. The sources of the MOS transistors M21 to M24 are commonly connected, and connected to the drain of the MOS transistor M20. The source of the MOS transistor M20 is connected to the ground 6. The negative input signal Vinn is applied to the gate of the MOS transistor M21, the positive input signal Vinp is applied to the gate of the MOS transistor M22, and a comparison reference voltage 200 is applied to the gates of the MOS transistors M23 and M24. The drains of the MOS transistors M21 and M22 are connected to the power source 12, the drain of the MOS transistor M23 is connected to the gate of the MOS transistor M10, and the drain of the MOS transistor M24 is connected to the gate of the MOS transistor M11. Except the above, the structure is similar to that of FIG. 6.

In the fully differential amplification device structured as described above, when the input DC voltage is as low as not more than the input dynamic range, if the circuit including the MOS transistors M20 to M24 is absent, the MOS transistors M1 and M2 are disabled, and when the drain currents of the MOS transistors M4 and M5 flow through the parasitic capacitances of the gates of the MOS transistors M10 and M11, the drain voltages of the MOS transistors M4 and M5 increase, so that the gate voltages of the MOS transistors M10 and M11 increase. Consequently, there are cases where the MOS transistors M10 and M11 are disabled, the drain voltages of the MOS transistors M10 and M11 decrease to a low voltage and the output common voltage is fixed at the low voltage.

This condition continues, for example, until the input DC voltage gradually increases into the input dynamic range after power-on and the MOS transistors M1 and M2 start to operate.

That is, the drain currents of the MOS transistors M4 and M5 flow through the parasitic capacitances of the gates of the MOS transistors M10 and M11 to increase the gate voltages of the MOS transistors M10 and M11, and shortly, the MOS transistors M10 and M11 are disabled. Therefore, the drain voltages of the MOS transistors M10 and M11 also decrease, no current flows through the MOS transistor M14 the drain voltage and gate voltage of the MOS transistor M16 increase, the MOS transistors M16, M4 and M5 are also disabled, and no current flows through the MOS transistors M4 and M5 either. However, the charges stored in the gate capacitances of the MOS transistors M10 and M11 are held, so that the MOS transistors M10 and M11 continue to be disabled. For this reason, the drain voltages of the MOS transistors M10 and M11 are held at the low voltage, and consequently, the output common voltage is fixed at the low voltage.

Therefore, the comparator 100 including an auxiliary current source of the MOS transistor M20 and the MOS transistors M21 to M24 is added, and when the input voltages (Vinp, Vinn) are lower than the comparison reference voltage 200, the current of the MOS transistor M20 serving as the current source flows through the MOS transistors M23 and M24 to decrease the gate voltages of the MOS transistors M10 and M11. Consequently, the drain voltages of the MOS transistors M10 and M11 increase, and the current of the MOS transistor M13 of the common mode feedback comparator 7 flows through the MOS transistors M14 and M16 to decrease the drain voltage and gate voltage of the MOS transistor M16 and decrease the gate voltages of the MOS transistors M4 and M5. If the currents of the MOS transistors M23 and M24 are higher than the drain currents of the MOS transistors M4 and M5, the output common voltage 41 is not fixed at the low voltage.

After power-on, the input DC level gradually increases, and when it becomes within a predetermined dynamic ranger the transistors M1 and M2 can perform amplification. For this reason, when the input voltage increases into the predetermined dynamic range, since the input voltage is higher than the comparison reference voltage 200, the current of the MOS transistor M20 flows to the power source 12 by way of the MOS transistors M21 and M22. Thereafter, the normal common mode feedback operation is performed, and the normal operation is performed.

Conventionally, there are cases where at the startup of the power source, at the time of switching of the mode and the like, the common mode feedback operation of the differential amplifier does not work normally, the stabilization point is other than the desired common voltage such as the power source or the ground (GND), and the operation is converged to other than the desired common voltage. For this reason, for example, as shown in Japanese Unexamined Patent Application Publication No. 2000-323940, when the input voltage is other than the dynamic range of the differential amplifier (operational amplifier), the new comparator 100 that detects whether the input voltage is within the dynamic range or not is provided, and by using the result of the comparison, auxiliary current for startup is fed.

Now, description will be given again with reference to FIG. 7 showing the conventional example. Although the input is Pch transistors in the example of Japanese Unexamined Patent Application Publication No. 2000-323940, for comparison with the present invention, description will be given as a differential amplifier in which the input differential transistors are Nch transistors. In Japanese Unexamined Patent Application Publication No. 2000-323940, there are cases where when the input voltage is outside the dynamic range, that is, when it is low enough to disable the MOS transistors M1 and M2, if the MOS transistors M4 and M5 are enabled, the MOS transistors M10 and M11 are disabled and this fixes the output common voltage 41 at the low voltage. For this reason, the new comparator 100 is provided that includes the MOS transistors M20 to M24 and compares the input dynamic range. When the input voltage is a low voltage that is outside the input dynamic range, the input voltage is lower than the comparison reference voltage 200, and the current of the MOS transistor M20 is fed to the positive output terminal 21 and the negative output terminal 22 of the differential amplifier 3, that is, to the gates of the inversion amplification MOS transistors M10 and M11 in the output common voltage generation circuit 4 by way of the MOS transistors M23 and M24 so as to increase the output common voltage 41 of the fully differential operational amplifier 3. When the input voltage is within the dynamic range, since the input voltage is higher than the comparison reference voltage 200, the current of the MOS transistor M20 is fed to the power source 12 through the MOS transistors M21 and M22.

However, when the input voltage is outside the dynamic range and lower than the reference voltage 200, the current of the MOS transistor M20 flows through the MOS transistors M23 and M24 and in order that the drain currents of the MOS transistors M23 and M24 can enable the MOS transistors M10 and M11, the transitional currents of the MOS transistors M23 and M24 in the condition where the input voltage is lower than the comparison reference voltage 200 are necessarily fed in a larger amount than the transitional currents of the MOS transistors M4 and M5. For this reason, a large amount of current is necessarily used for startup. In addition, the current is necessarily fed to the power source as useless current after normal startup.

Moreover, since the gates of the startup MOS transistors M21 and M22 are connected to the input in addition to the differential amplification transistors, the unnecessary parasitic capacitances by the MOS transistors M21 and M22 are added to the input, so that the frequency characteristic is deteriorated.

Moreover, in order that the comparator 100 operates normally, it is necessary that The reference voltage 200 be higher than a voltage which is the sum of the gate-source voltages of the MOS transistors M23 and M24 and an overdrive voltage of the MOS transistor M20, that is, a voltage which is the difference when a threshold voltage Vth is subtracted from the gate-source voltage Vgs20 of the MOS transistor M20. Moreover, to completely switch the comparator 100, it is necessary that the input voltage be higher than a voltage which is the sum of the reference voltage 200 and the overdrive voltages of the MOS transistors M21 and M22 multiplied by $\sqrt{2}$. For this reason, for example, when the lower limit voltage of the input is 1V (the overdrive voltage {Vgs3−Vth} of the MOS transistor M3+the gate-source voltages Vgs1 of the MOS transistors M1 and M2) and the overdrive voltages of the MOS transistors M21 to M24 are 0.2 V, it is necessary that the reference voltage 200 be approximately 1.3 V so that the comparator 100 is completely switched.

When setting is made like this, the lower limit voltage of the input is approximately 1.6 V since it is necessary to completely switch the comparator 100. As a consequence, by the addition of the comparator 100, the lower limit voltage of the input is significantly reduced from 1.0 V to 1.6 V, and the input dynamic range is reduced. With the process becoming finer recently, from the limitation of the withstand voltage, for example in the 0.18 micron process, the standard power supply voltage is 1.8 V, and it is difficult to structure an amplifier with measures Like those of the conventional example. Moreover, to reduce the overdrive voltage, it is necessary to increase the size of the transistors, and the increase in size as well as the increase in the number of transistors of the comparator increases the chip area.

SUMMARY OF THE INVENTION

An object of the present invention is to provide a fully differential amplification device that has a common mode feedback circuit having a small-current, small-area startup circuit with little parasitic capacitance and without any decrease in input dynamic range.

To achieve the above-mentioned object, in a fully differential amplification device of the present invention, in order that the output common voltage is always a desired voltage even when the input DC voltage is outside the dynamic range, minimum auxiliary current necessary for startup is flown through the differential amplifier at the input so that startup is performed with stability. Correction current corresponding to the above-mentioned auxiliary current is flown through the common mode feedback comparator. With this structure, a new comparator is unnecessary, no decrease in input dynamic range is brought about, and no unnecessary parasitic capacitance is added to the input of the differential amplifier.

That is, this fully differential amplification device is provided with: a differential amplifier that is fed with a positive input signal and a negative input signal, and outputs a positive output signal and a negative output signal; an output common voltage generation circuit that is fed with and amplifies the positive output signal and the negative output signal outputted from the differential amplifier, generates a positive amplification signal and a negative amplification signal, and generates an output common voltage from the positive amplification signal and the negative amplification signal; a common mode feedback comparator that compares the output common voltage of the output common voltage generation circuit with a predetermined reference voltage, and feeds back a result of the comparison of the output common voltage with the predetermined reference voltage to the differential amplifier as a common mode feedback signal to thereby make the output common voltage coincide with the reference voltage; and an auxiliary current supply circuit having a current source that always feeds current to an input portion, in the output common voltage generation circuit, to which the positive output signal and the negative output signal are inputted.

According to this structure, it is necessary only to provide a current source that flows minimum current at the time of startup, current is not continuously flown after startup, and it is unnecessary to flow extra current. Since it is unnecessary to provide a comparator like that of the conventional example, no decrease in input dynamic range is brought about. Moreover, the lower limit of the input DC level can be further reduced, which is advantageous in reducing the power supply voltage. This is because the MOS transistors for the current source whose drain voltages are high always operate in the saturation region and never decrease the input dynamic range. Further, the parasitic capacitance in the input portion of the differential amplifier can be reduced, so that the high frequency characteristic is never deteriorated. In addition, the circuit arrangement is simple compared with when the comparator is provided as in the conventional example, which is advantageous in reducing the chip area.

In the above-described structure, the differential amplifier is provided with, for example: a differential transistor pair; a differential amplification current source commonly connected to the differential transistor pair; and a load current source pair whose load current sources are connected to differential transistors of the differential transistor pair, respectively. The positive input signal and the negative input signal are fed to control electrodes of the differential transistors of the differential transistor pair, respectively. The positive output signal and the negative output signal are taken out from connecting points of the differential transistors of the differential transistor pair and the load current sources of the load current pair.

Moreover, in the above-described structure, the output common voltage generation circuit is provided with, for example: an output inversion amplification transistor pair that inverts the positive output signal and the negative output signal of the differential amplifier in an input portion thereof; and a series circuit of a first and second resistor connected between output terminals of transistors of the output inversion amplification transistor pair. The output common voltage is outputted from a middle point between the first and second resistors.

Moreover, in the above-described structure, the common mode feedback comparator is provided with, for example: a comparison transistor pair that compares the common voltage outputted from the output common voltage generation circuit with the predetermined reference voltage; a comparison current source commonly connected to the comparison transistor pair; and a current feedback transistor pair whose current feedback transistors are connected to comparison transistors of the comparison transistor pair, respectively, and that changes current flowing through the load current source pair based on a signal representative of a result of the comparison by the comparison transistor pair.

Preferably, the load current source pair includes a load current source transistor pair, and one of the current feedback transistors of the current feedback transistor pair and load current source transistors of the load current source transistor pair constitute a current mirror circuit.

In the above-described structure, preferably, the differential transistor pair includes a MOS transistor pair or includes a bipolar transistor pair. Moreover, the output common voltage generation circuit may have a buffer pair including bipolar transistors between the output terminals of the output inversion amplification transistor pair and the series circuit of the first and second resistors.

By the present invention, the common mode feedback of the differential amplifier (operational amplifier) can be started with stability at the time of startup of the power source, at the time of switching of the mode and the like. Moreover, no decrease in input dynamic range is brought about. Moreover, the high frequency characteristic is never deteriorated, and no new comparator is necessary.

DESCRIPTION OF PREFERRED EMBODIMENTS

First Embodiment

Figure 1:
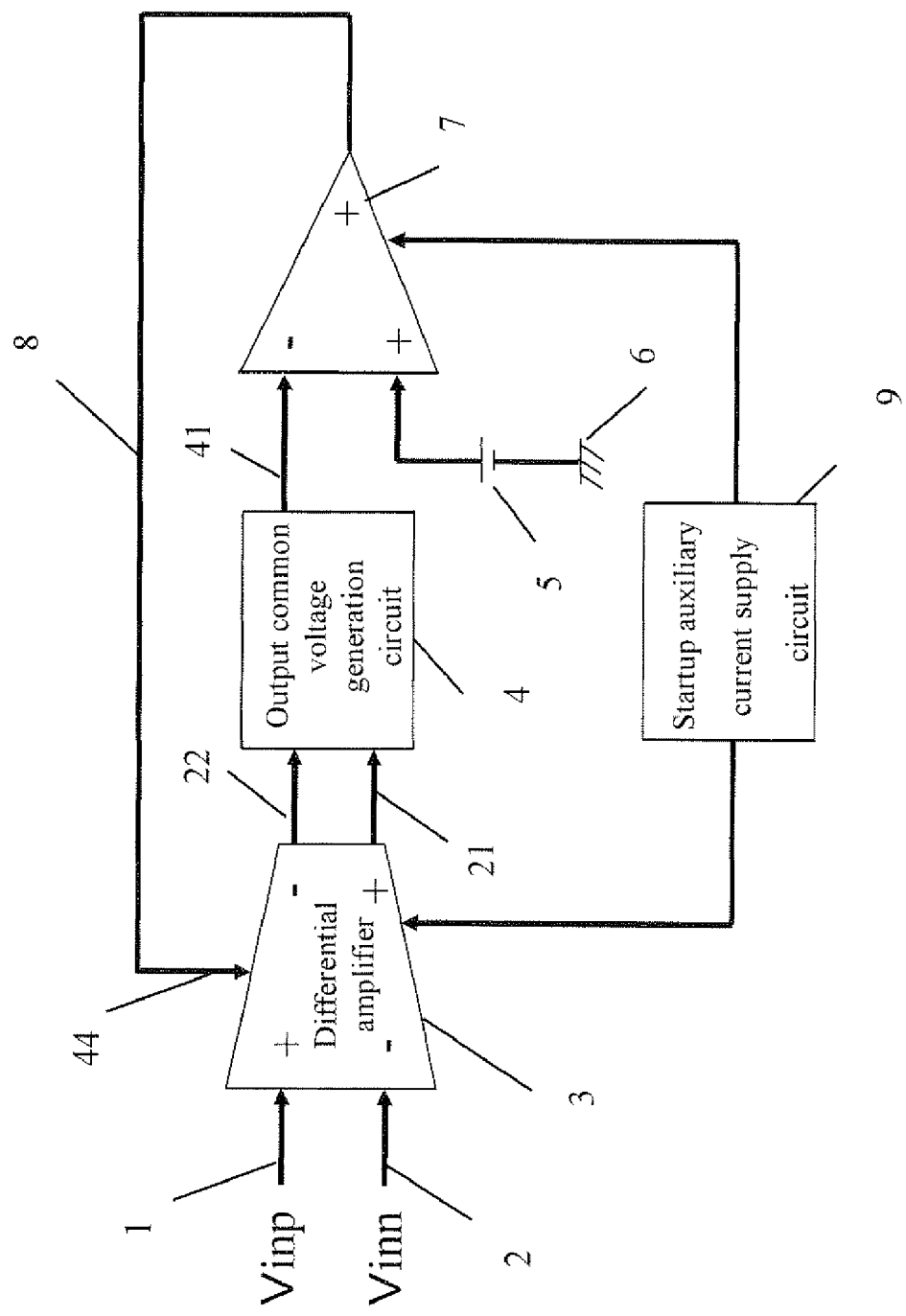
FIG. 1 is a block diagram showing the general outline of a fully differential amplification device having common mode feedback according to a first embodiment of the present invention.

FIG. 1 is a block diagram showing a fully differential amplification circuit of a first embodiment. Hereinafter, description will be given with reference to FIG. 1. In a differential amplifier 3, a positive input signal Vinp is inputted to a positive input terminal 1, and a negative input signal Vinn is inputted to a negative input terminal 2. The differential amplifier 3 generates a positive output signal Voutp1 and a negative output signal Voutn1 from a positive output terminal 21 and a negative output terminal 22, respectively. The positive output signal Voutp1 and the negative output signal Voutn1 of the differential amplifier 3 are inputted to a common voltage generation circuit 4.

The common voltage generation circuit 4 generates the output common voltage of the differential amplifier 3 based on the positive output signal Voutp1 and the negative output signal Voutn1 of the differential amplifier (operational amplifier) 3. An output common voltage 41 of the differential amplifier 3 which is the output of the common voltage generation circuit 4 is inputted to an inverting input terminal of a common mode feedback comparator 7. A reference voltage 5 is inputted to a noninverting input terminal of the common mode feedback comparator 7. Reference numeral 6 represents the ground (GND).

The common mode feedback comparator 7 compares the output common voltage 41 of the differential amplifier 3 with the reference voltage 5, and feeds back a common mode feedback signal 8 representative of the result of the comparison, to a common mode feedback terminal 44 of the differential amplifier 3 to thereby cause the differential amplifier 3 to operate so that the output common voltage 41 of the differential amplifier 3 is the reference voltage 5.

In addition, a startup auxiliary current supply circuit 9 is provided, and from the startup auxiliary current supply circuit 9, auxiliary current and correction current are supplied to the differential amplifier 3 and the common mode feedback comparator 7, respectively.

Figure 2:
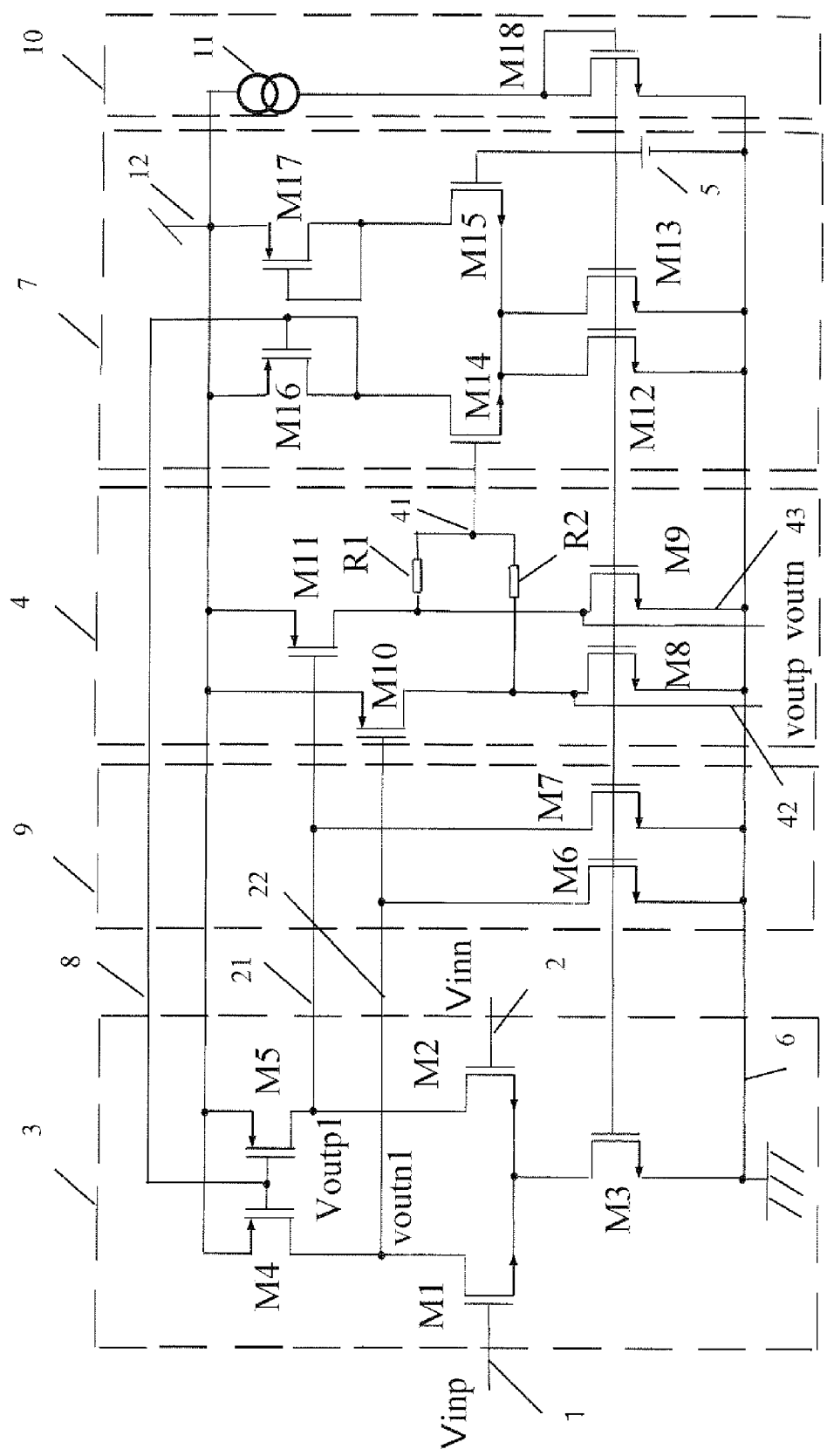
FIG. 2 is a circuit diagram showing a concrete circuit of the fully differential amplification device having common mode feedback according to the first embodiment of the present invention.
Figure 6:
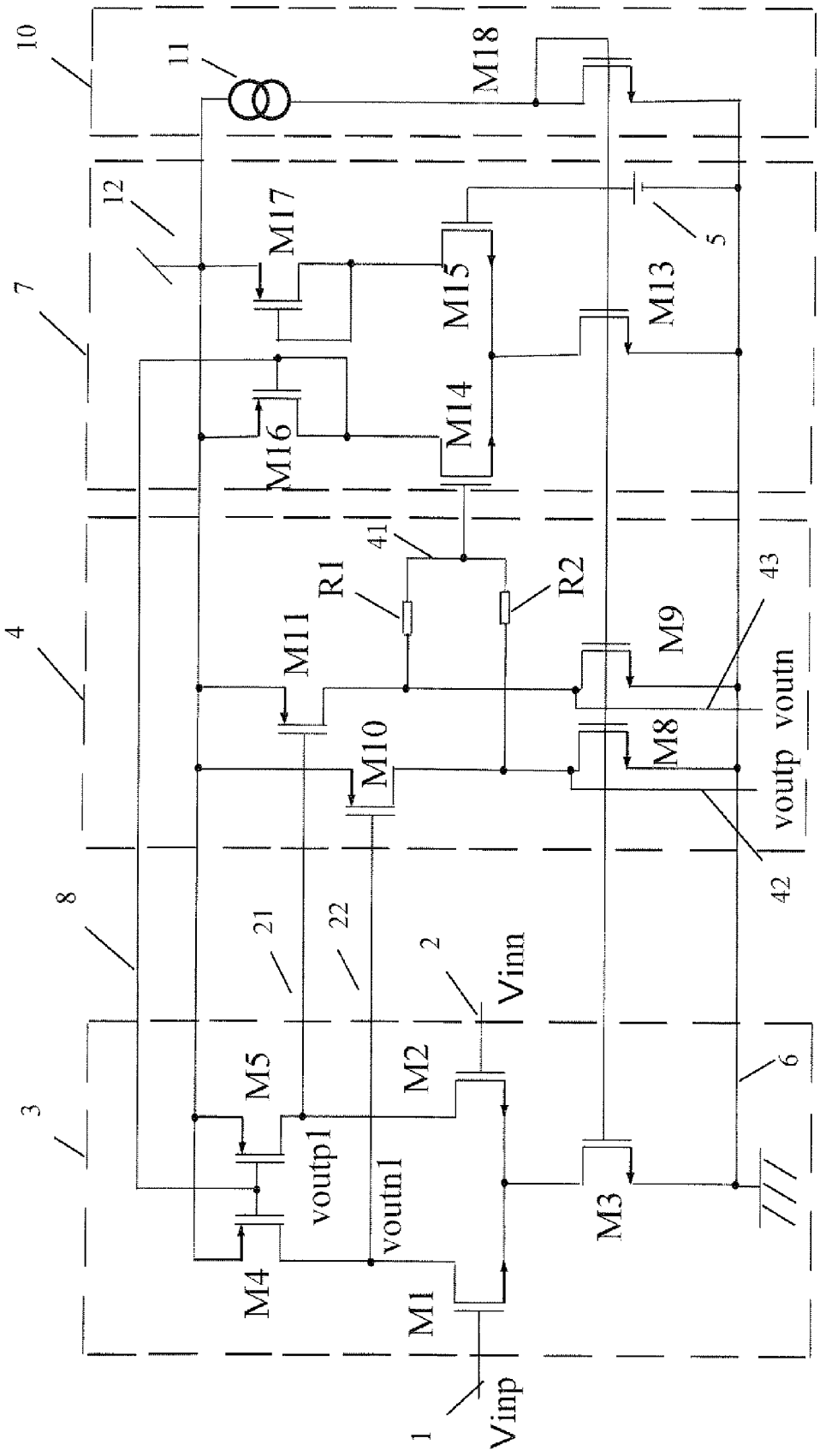
FIG. 6 is a circuit diagram showing the concrete circuit of the conventional fully differential amplification device having common mode feedback.

FIG. 2 shows a concrete example of the circuit of the fully differential amplification device of the first embodiment of the present invention. The difference from the conventional example of FIG. 6 is that MOS transistors MG and M7 (auxiliary current source) constituting the startup auxiliary current supply circuit 9 and a MOS transistor M12 (correction current source) are provided. Except this, the structure is similar to that of FIG. 6.

The MOS transistor M6 has its drain connected to the gate of the MOS transistor M10, that is, the drains of the MOS transistors M1 and M4, and has its source connected to the ground 6.

The MOS transistor M7 has its drain connected to the gate of the MOS transistor M11, that is, the drains of the MOS transistors M2 and M5, and has its source connected to the ground 6.

The MOS transistor M12 has its drain commonly connected to the sources of the MOS transistors M14 and M15, and has its source connected to the ground 6.

The gates of the MOS transistors M6, M7 and M12 which constitute a current mirror circuit are connected to the gate and drain of the MOS transistor M18.

While the MOS transistor M12 is provided to correct the current flowing through the MOS transistors M6 and M7 on the assumption that the size of the MOS transistor M13 is the same as that of the MOS transistor M13 of the conventional example of FIG. 6, the MOS transistor M12 can be omitted by designing the size of the MOS transistor M13 in consideration of the currents of the MOS transistors M6 and M7.

Hereinafter, with respect to the operation of this fully differential amplification device, the difference from the conventional example will be described, and description of the part of the operation similar to that of the conventional example is omitted.

In FIG. 2, like the conventional example, to the differential amplifier 3 including the MOS transistors M1 to M5, the positive input signal Vinp is inputted from the positive input terminal 1, and the negative input signal Vinn is inputted from the negative input terminal 2. If the input DC voltage is low enough to be outside the input dynamic range, although the MOS transistors M1 and M2 are disabled, the currents of the MOS transistors M6 and M7 decrease the gate voltages of the MOS transistors M10 and M11. Consequently, the drain voltages of the MOS transistors M10 and M11 increase, and this increases the output common voltage 41, so that current starts to flow through the MOS transistor M14. Thereby, the drain voltage of the MOS transistor M16 is decreased, the gate voltages of the MOS transistors M16, M4 and M5 are decreased, and the drain currents of the MOS transistors M4 and M5 are increased. Then, the operation is converged to an operating point where the currents of the MOS transistors M4 and M5 balance with the currents of the MOS transistors M6 and M7.

Therefore, only a small amount of current is necessarily flown through the MOS transistors M6 and M7. That is, in the embodiment of the present invention, since the currents of the MOS transistors M6 and M7 are steady state current, by flowing a small amount of current, the MOS transistors M10 and M11 are enabled before long irrespective of whether the currents of the MOS transistors M4 and M5 are transitional or not. Therefore, common mode negative feedback is made so that the drain currents of the MOS transistors M4 and M5 are the same as those of the MOS transistors M6 and M7 when the input voltage is not within the dynamic range and the MOS transistors M1 and M2 are disabled.

Thereafter, when the input becomes within the normal dynamic range, the steady state current of the MOS transistor M4 is determined so that it is the same as the sum of the current of the MOS transistor M1 and the current of the MOS transistor M6. Likewise, the steady state current of the MOS transistor M5 is determined so that it is the same as the sum of the current of the MOS transistor M2 and the current of the MOS transistor M7.

At this time, the output common voltage 41 of the differential amplifier 3 is slightly lower than the desired reference voltage 5. Why the output common voltage 41 is slightly lower will be explained in the following: In a correctly balanced condition, by half the sum of the currents of the MOS transistors M12 and M13 flowing through the MOS transistor M14, the output common voltage 41 is the same as the reference voltage 5. Assume now that the operation is converged to a condition where the currents of the MOS transistors M6 and M7 are small and the currents of the MOS transistors M4 and M5 are also small. Then, the current flowing through the MOS transistor M14 is smaller than half the sum of the currents of the MOS transistors M12 and M13. Therefore, for example, when the sum of the currents of the MOS transistor M12 and the MOS transistor M13 is Io, a quarter thereof flows through the MOS transistor M14 and $\beta=\mu Cox(W/L)$, the gate-source voltage Vgs14 of the MOS transistor M14 is lower than the gate-source voltage Vgs15 of the MOS transistor M15, and the output common voltage is lower than the reference voltage 5 by $(2Io/\beta)^{1/2}*(\sqrt{3}-1)/2$ which is the difference between the voltages Vgs14 and Vgs15.

However, when the input DC voltage becomes within the dynamic range and the MOS transistors M1 and M2 start to operate as a differential amplifier, since the current of the MOS transistor M3 is supplied to the gates of the MOS transistors M10 and M11, the currents of the MOS transistors M4 and M5 flow so as to balance with the current. Since the common mode loop is negative feedback, for example, when the current of the MOS transistor M3 starts to flow through the MOS transistor M1, the gate voltages of the MOS transistors M10 and M11 decrease, and the output common voltage increases. Consequently, the drain currents of the MOS transistors M14 and M16 increase, and the currents of the MOS transistors M4 and M5 also increase. When the currents of the MOS transistors M4 and M5 become larger than the sum of half the current of the MOS transistor M3 and the current of the MOS transistor M6, the gate voltage of the MOS transistor M10 increases and the gate voltage of the MOS transistor M11 similarly increases, so that the drain currents of the MOS transistors M10 and M11 decrease and the output common voltage 41 decreases. Then, this time, the currents of the MOS transistors M14 and M16 decrease, and the currents of the MOS transistors M4 and M5 also decrease. After all, the common mode loop works so that the currents of the MOS transistors M4 and M5 are the sum of half the current of the MOS transistor M3 and the current of the MOS transistor M6.

Figure 7:
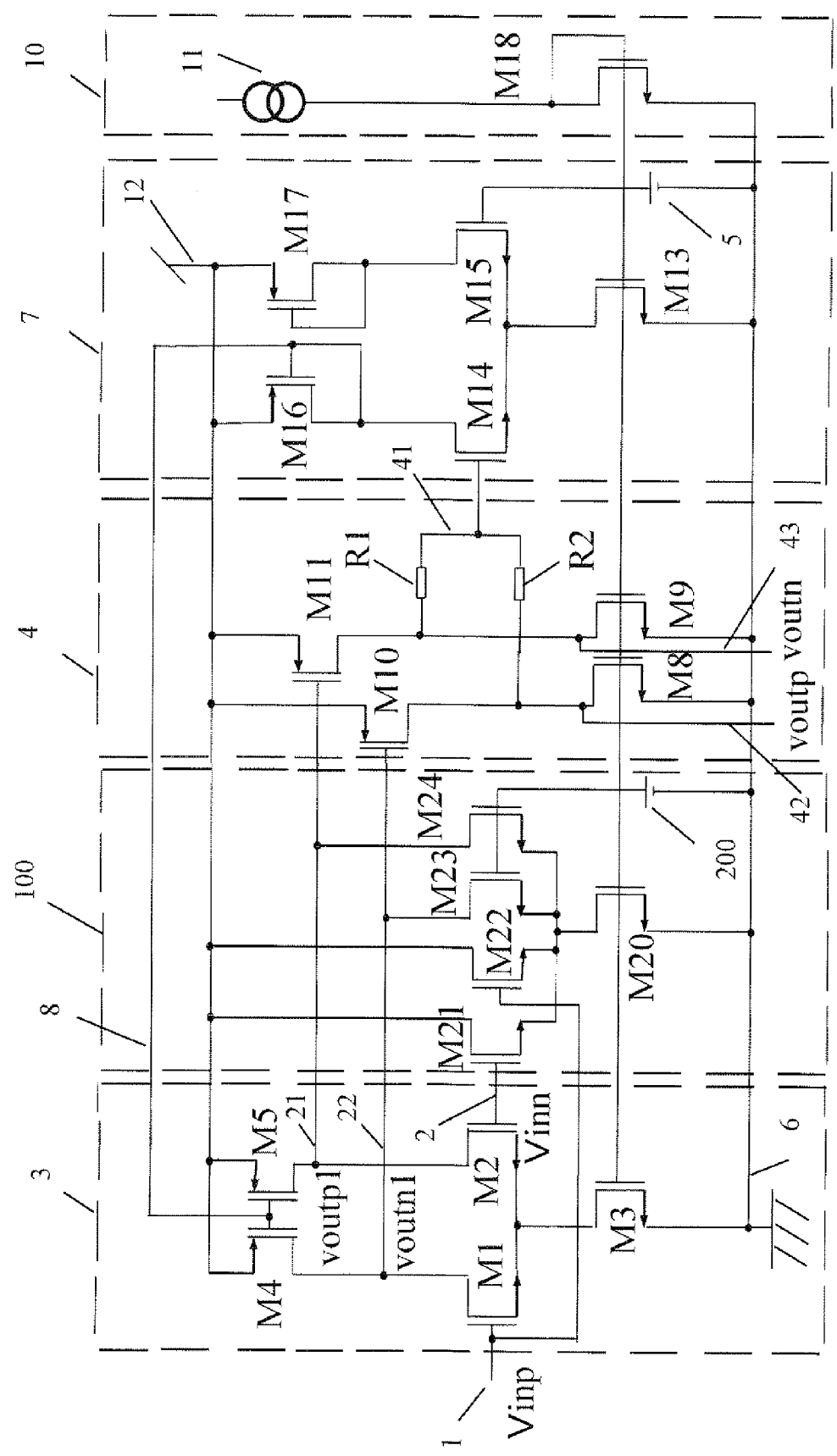
FIG. 7 is a circuit diagram showing the concrete circuit of another conventional fully differential amplification device having common mode feedback.
Figure 8:
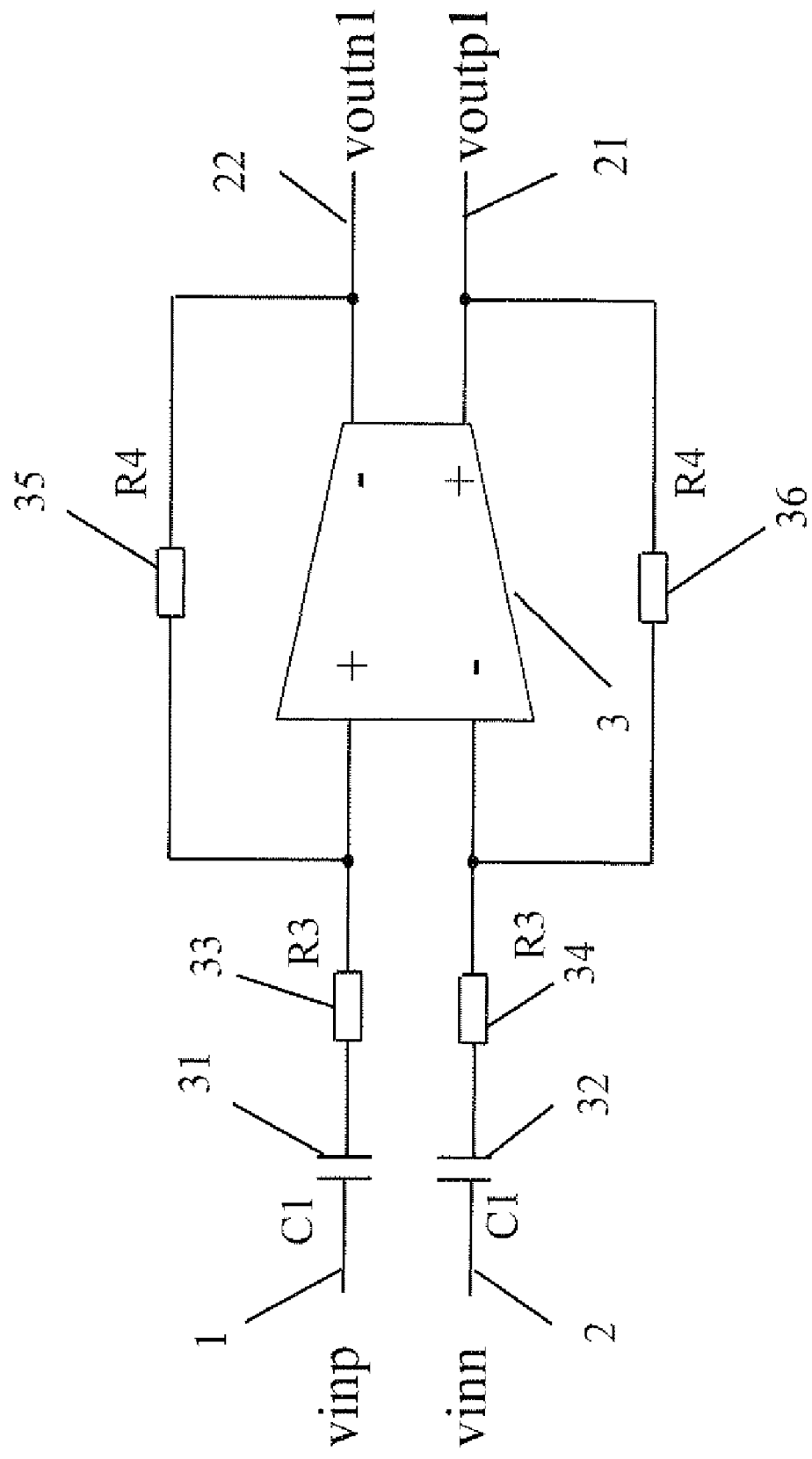
FIG. 8 is a circuit diagram showing the concrete circuit of still another conventional fully differential amplification device having common mode feedback.

Therefore, the currents of the MOS transistors M12 and M13 and the current mirror ratio between the MOS transistor M16 and the MOS transistors M4 and M5 are set so that the currents of the MOS transistors M4 and M5 flow in an amount the same as the sum of half the current of the MOS transistor M3 and the sum of the currents of the MOS transistors M6 and M7 just when the output common voltage 41 of the differential amplifier 3 becomes the same as the desired reference voltage 5. By doing this, startup can be performed with stability, so that it is unnecessary to flow, to the power source, extra current like that flowing to the MOS transistors M21 and M22 of FIG. 7. Moreover, since elements such as the MOS transistors M23 and M24 of FIG. 7 are never connected to the MOS transistors M1 and M2, no unnecessary parasitic capacitance is added to the input.

As described above, in this fully differential amplification device, by providing the current source including the MOS transistors M6, M7 and M12, a startup function is provided, and the output common voltage 41 can be converged to a normal desired voltage even when the input voltage and the output voltage are outside the dynamic range of the amplifier.

According to this structure, it is necessary only to provide an auxiliary current source that flows minimum current at the time of startup, current is not continuously flown after startup, and it is unnecessary to flow extra current. Since it is unnecessary to provide a comparator like that of the conventional example, no decrease in input dynamic range is brought about. Moreover, the lower limit of the input DC level can be further reduced, which is advantageous in reducing the power supply voltage. This is because the MOS transistors for the auxiliary current source whose drain voltages are high always operate in the saturation region and never decrease the input dynamic range. Further, the parasitic capacitance in the input portion of the differential amplifier can be reduced, so that the high frequency characteristic is never deteriorated. In addition, the circuit arrangement is simple compared with when the comparator is provided as in the conventional example, which is advantageous in reducing the chip area.

Second Embodiment

Figure 3:
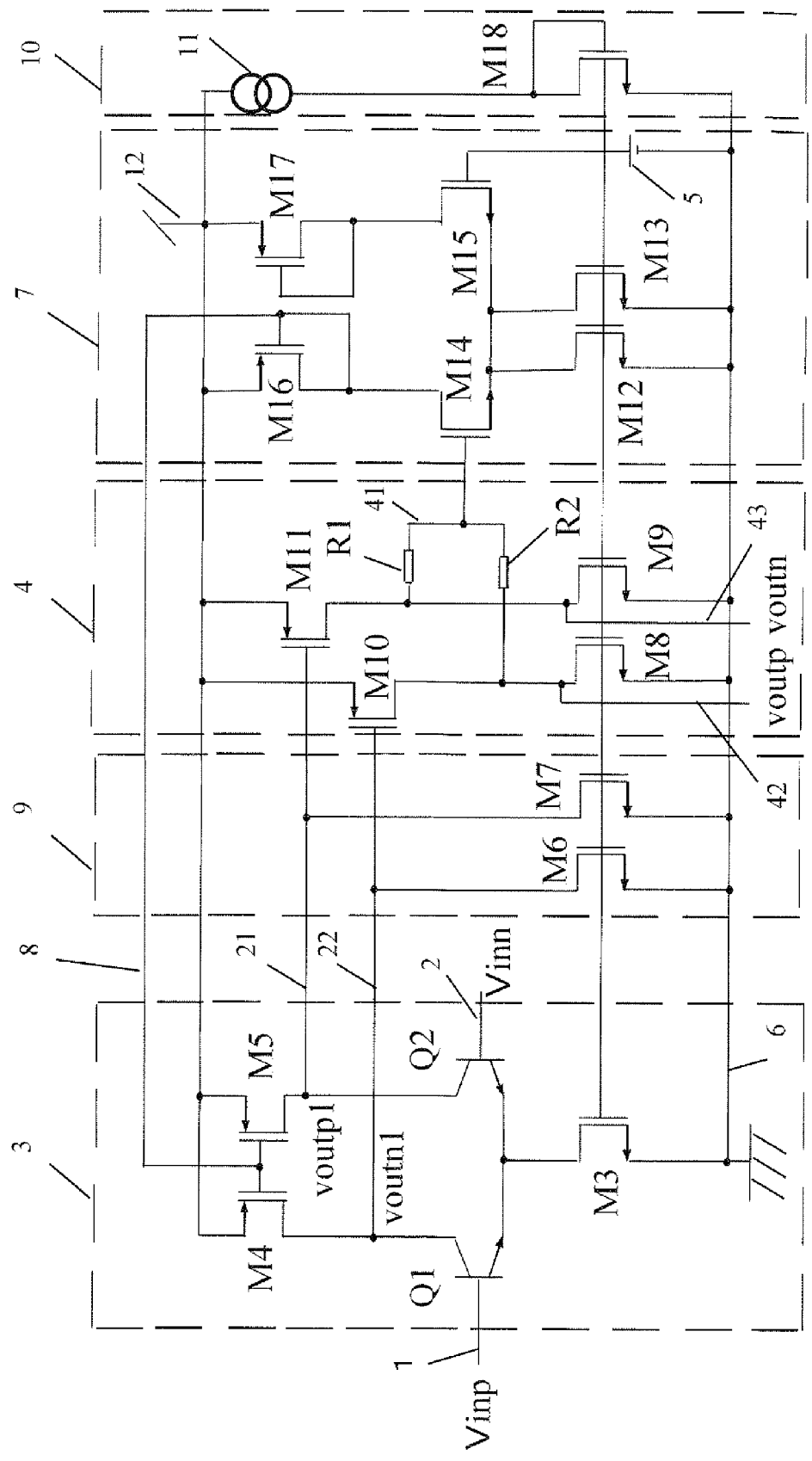
FIG. 3 is a circuit diagram showing a concrete circuit of a fully differential amplification device having common mode feedback according to a second embodiment of the present invention.

FIG. 3 shows a second embodiment of the present invention using bipolar NPN transistors Q1 and Q2 as input differential transistors. Except this, the structure is the same as that of FIG. 1. Bipolar NPN transistors are frequently used in high frequency circuits because when they are used, the mutual conductance gm can be made higher than that when MOS transistors are used with the same current and when heterojunction transistors (HBTs) such as SiGe are used, a high frequency characteristic can be obtained.

Figure 9:
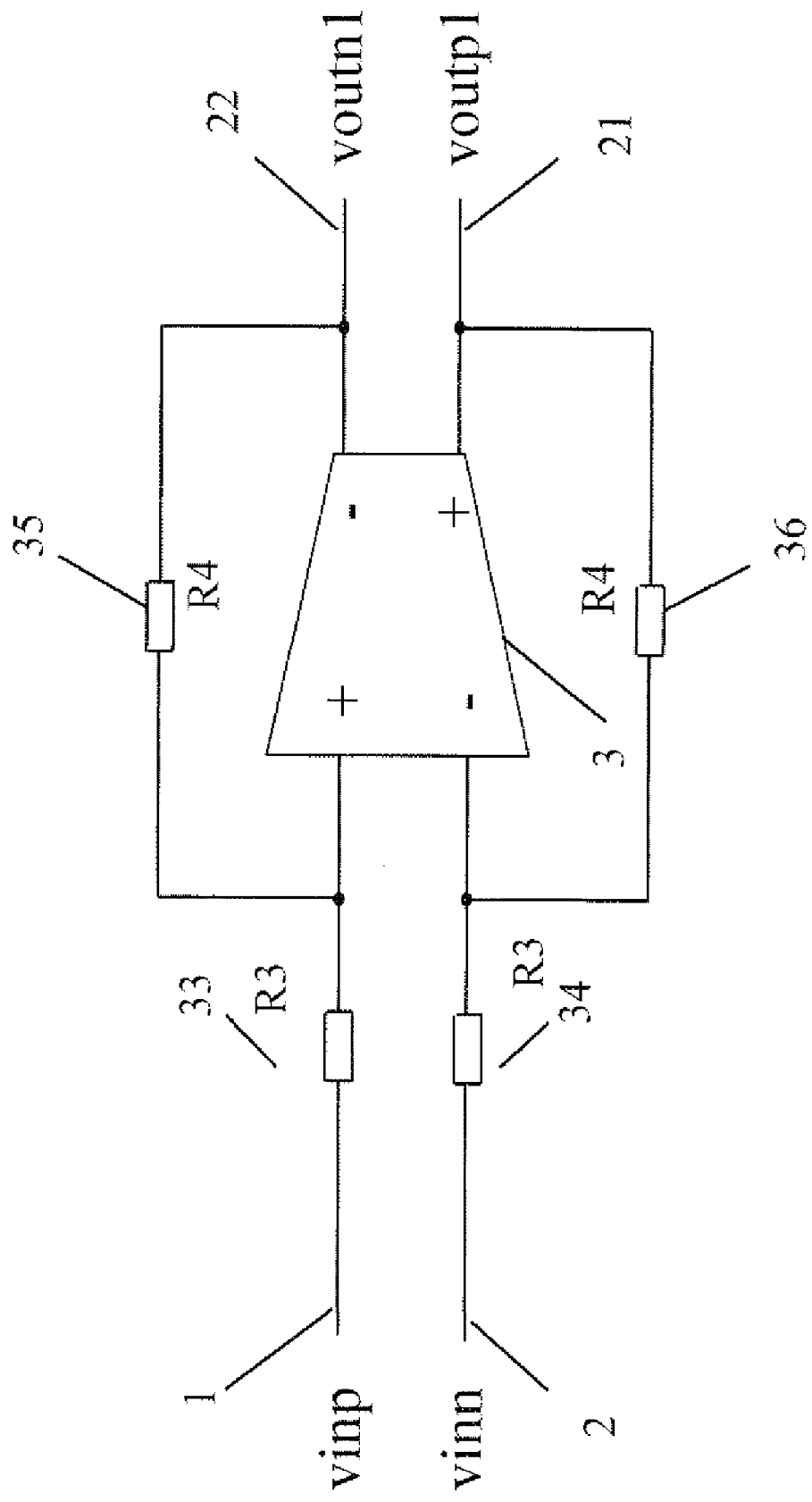
FIG. 9 is a circuit diagram showing the concrete circuit of yet another conventional fully differential amplification device having common mode feedback.
Figure 10:
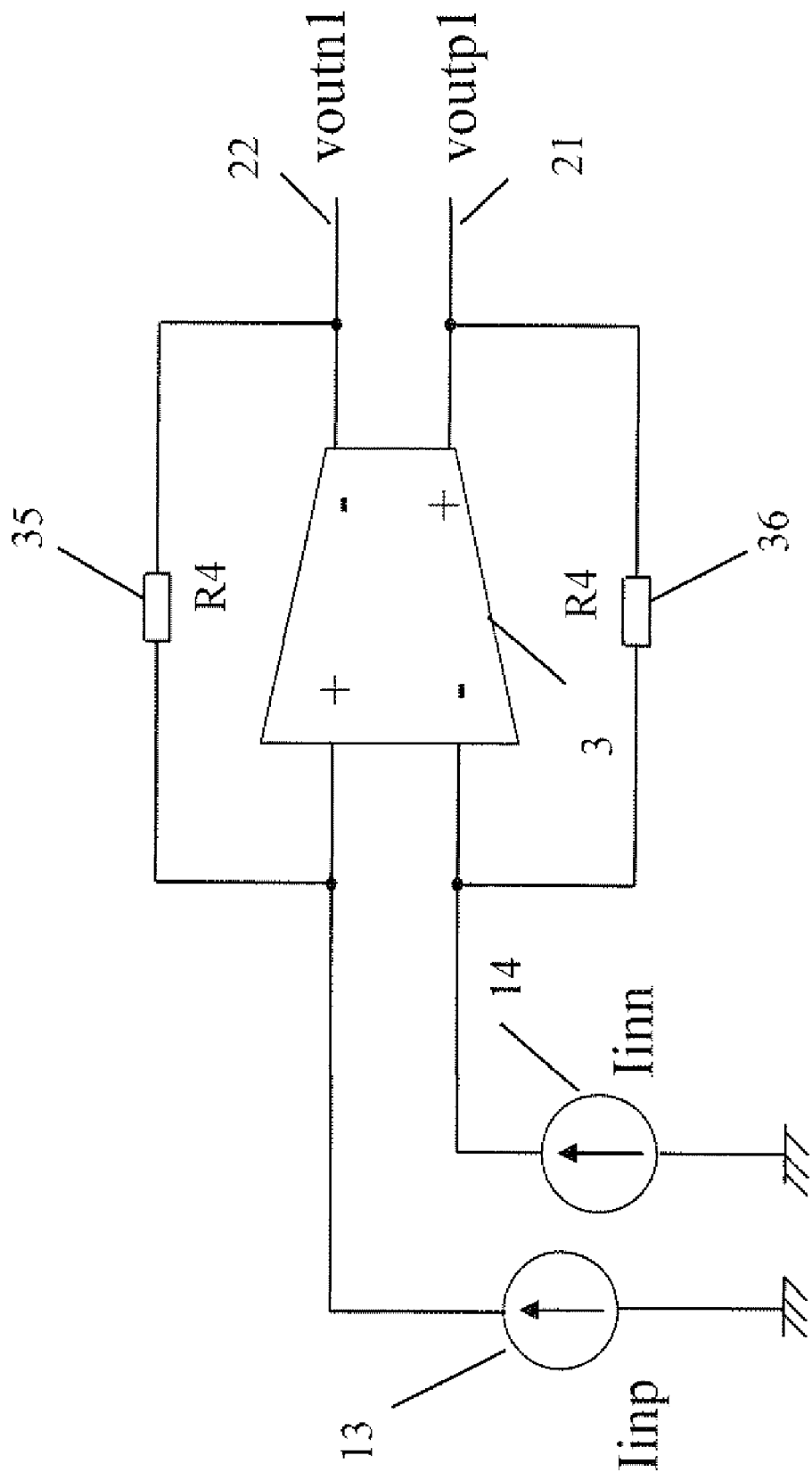
FIG. 10 is a circuit diagram showing the concrete circuit of still yet another conventional fully differential amplification device having common mode feedback.

However, since the base current flows through the bipolar NPN transistors, when the input is driven at high impedance as in the examples of FIG. 9 and FIG. 10, a potential drop is caused by the base current, so that there are frequently cases where the bipolar NPN transistors Q1 and Q2 are started in disabled state. At this time, when the MOS transistors M6 and M7 are absent, the MOS transistors M10 and M11 are disabled, the MOS transistor M14 is also disabled, and the MOS transistors M4 and M5 are also disabled, so that the output common voltage 41 is fixed at a low voltage in the vicinity of the ground (GND).

Therefore, by flowing the currents of the MOS transistors M6 and M7 to the gates of the MOS transistors M10 and M11, the gate voltages of the MOS transistors M10 and M11 can be decreased, so that the MOS transistors M10 and M11 are enabled to increase the output common voltage 41. Consequently, the MOS transistor M14 is enabled, and the MOS transistors M4 and M5 are also enabled, so that the operation is converged to an operating point where the currents of the MOS transistors M4 and M5 are the same as those of the MOS transistors M6 and M7. After the input voltage has become the desired voltage, the bipolar NPN transistors Q1 and Q2 are enabled, and by making equal the currents flowing through the MOS transistors M4 and M5 and the currents flowing through the bipolar NPN transistors Q1 and Q2 and the MOS transistors M6 and M7 just when the MOS transistor M14 and the MOS transistor M15 balance with each other, the output common voltage 41 of the differential amplifier (operational amplifier) becomes the same potential as that of the desired reference voltage 5.

The effects of this embodiment are similar to those of the first embodiment.

Third Embodiment

Figure 4:
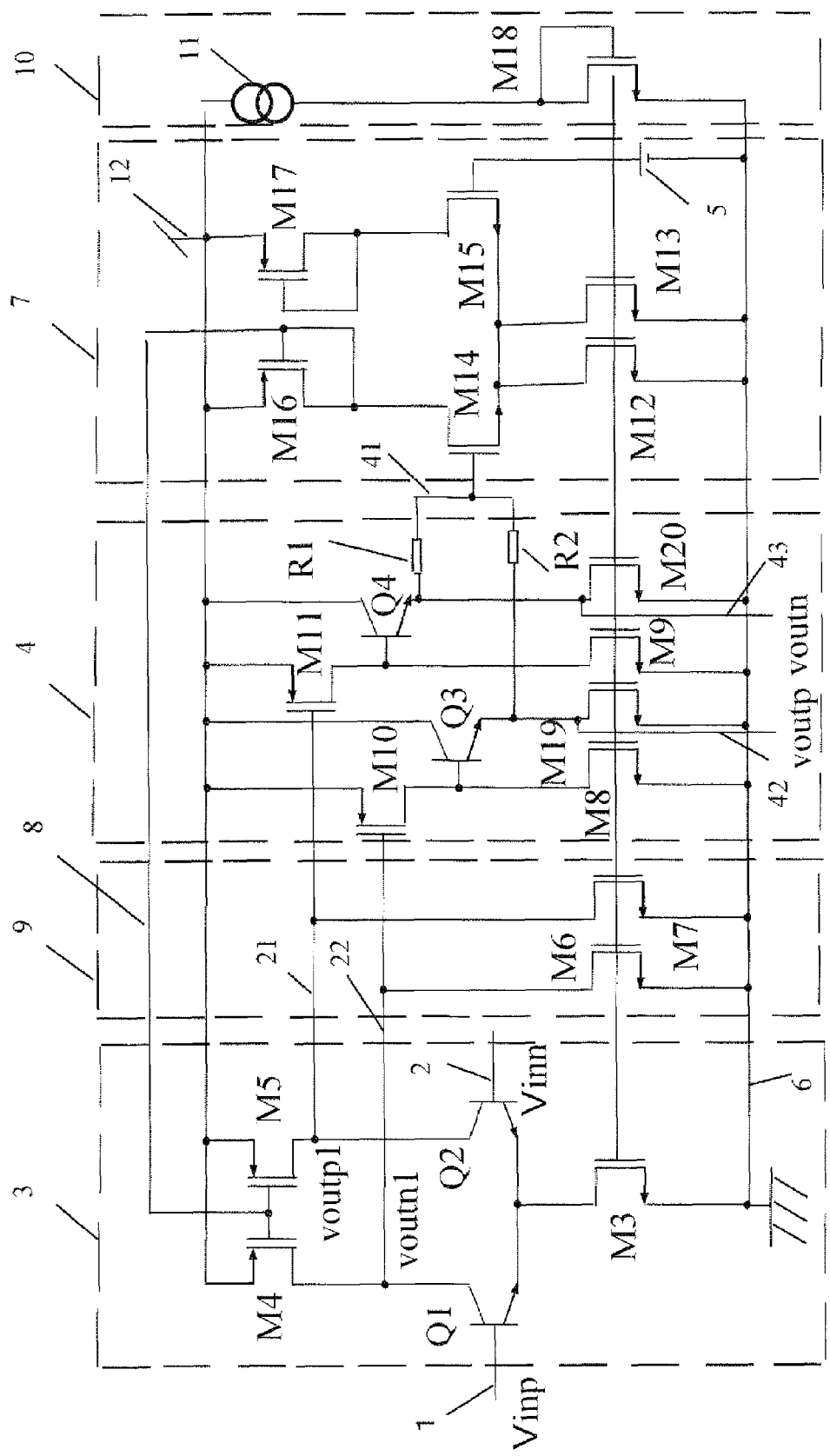
FIG. 4 is a circuit diagram showing a concrete circuit of a fully differential amplification device having common mode feedback according to a third embodiment of the present invention.
Figure 5:
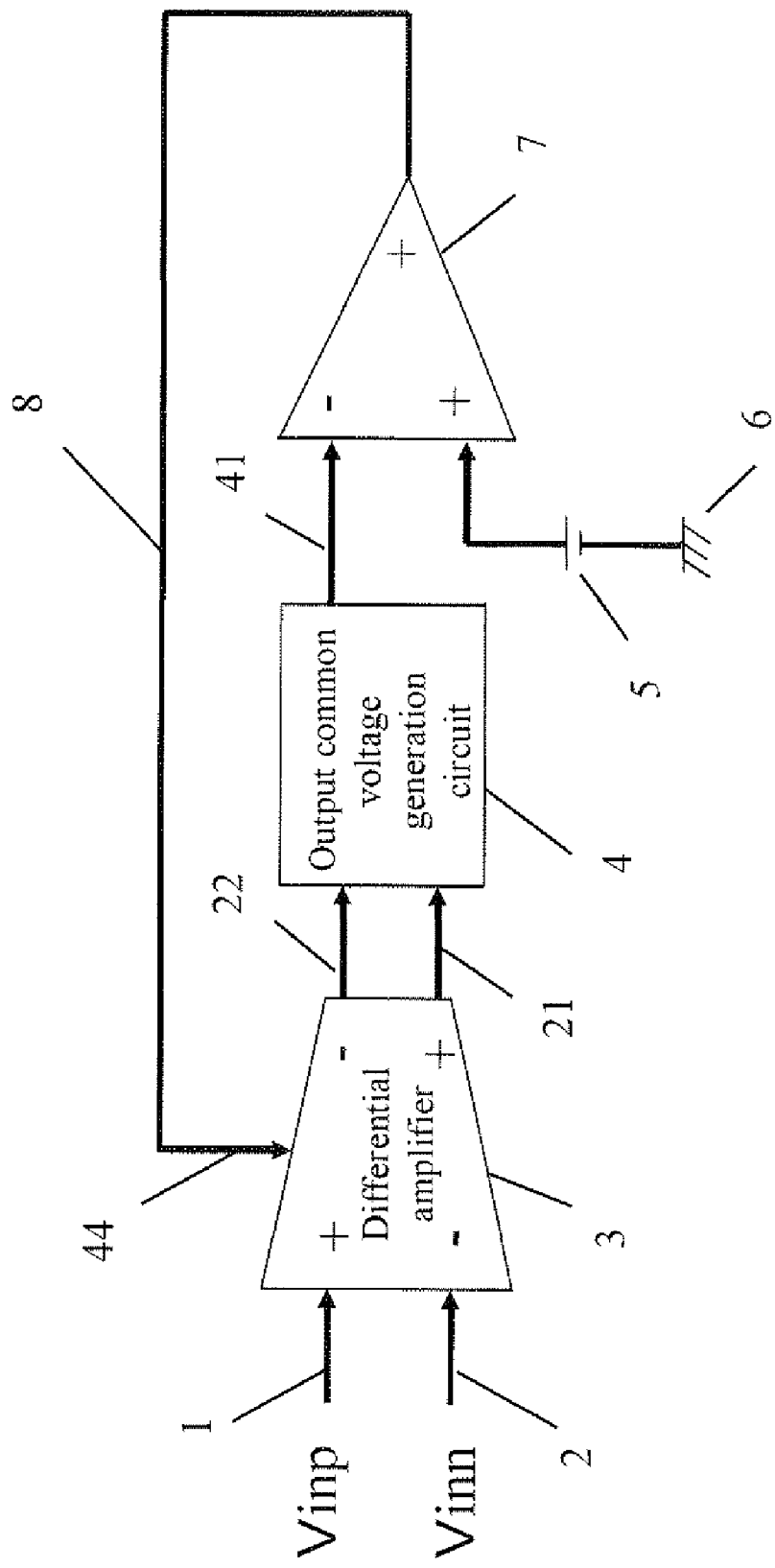
FIG. 5 is a block diagram showing the general outline of the conventional fully differential amplification device having common mode feedback.

FIG. 4 shows a third embodiment. In FIG. 4, bipolar NPN transistors Q3 and Q4 constitute the output buffer of the operational amplifier, which produces an effect of decreasing the output impedance of the operational amplifier.

That is, in the fully differential amplification device of the present embodiment, the negative output signal Voutn1 of the differential amplifier 3 is inversion-amplified by the MOS transistor M10, amplified by the bipolar NPN transistor Q3, and then, outputted as the positive output signal Voutp from the positive output terminal 42 with the output impedance decreased.

Likewise, the positive output signal Voutp1 of the differential amplifier 3 is inversion-amplified by the MOS transistor M11, amplified by the bipolar NPN transistor Q4, and then, outputted as the negative output signal Voutn from the negative output terminal 43 with the output impedance decreased.

However, when such an output buffer is added, even slight insufficiency of the base currents of the bipolar NPN transistors Q3 and Q4 increases the possibility that the output common voltage 41 is fixed at a low potential. Therefore, for this structure, the effect of the MOS transistors M6, M7 and M12 is higher, and the output operating point of the differential amplifier (operational amplifier) can be converged to the desired common voltage with stability.

The effects of this embodiment are similar to those of the first embodiment.

With respect to the conductive form of the MOS transistors and the bipolar transistors, either form may be used according to the way in which the circuit of the fully differential amplification device is designed.

INDUSTRIAL APPLICABILITY

As described above, in the fully differential amplification device of the present invention, common mode feedback of the differential amplifier can be started with stability. This device is useful for communication systems, mixed signal processing systems and the like.

What is claimed is:
1. A fully differential amplification device comprising:
a differential amplifier that is fed with a positive input signal and a negative input signal, and outputs a positive output signal and a negative output signal;
an output common voltage generation circuit that is fed with and amplifies the positive output signal and the negative output signal outputted from the differential amplifier, generates a positive amplification signal and a negative amplification signal, and generates an output common voltage from the positive amplification signal and the negative amplification signal;
a common mode feedback comparator that compares the output common voltage of the output common voltage generation circuit with a predetermined reference voltage, and feeds back a result of the comparison of the output common voltage with the predetermined reference voltage to the differential amplifier as a common mode feedback signal to thereby make the output common voltage coincide with the reference voltage; and
a current source that always feeds current to an input portion, in the output common voltage generation circuit, to which the positive output signal and the negative output signal are inputted.

2. The fully differential amplification device according to claim 1, wherein the differential amplifier comprises a differential transistor pair, a differential amplification current source commonly connected to the differential transistor pair, and a load current source pair whose load current sources are connected to differential transistors of the differential transistor pair, respectively; the positive input signal and the negative input signal are fed to control electrodes of the differential transistors of the differential transistor pair, respectively; and the positive output signal and the negative output signal are taken out from connecting points of the differential transistors of the differential transistor pair and the load current sources of the load current pair.

3. The differential amplification device according to claim 1, wherein the output common voltage generation circuit comprises an output inversion amplification transistor pair that inverts the positive output signal and the negative output signal of the differential amplifier in an input portion thereof, and a series circuit of a first and second resistor connected between output terminals of transistors of the output inversion amplification transistor pair; and the output common voltage is outputted from a middle point between the first and second resistors.

4. The fully differential amplification device according to claim 2, wherein the common mode feedback comparator comprises: a comparison transistor pair that compares the common voltage outputted from the output common voltage generation circuit with the predetermined reference voltage; a comparison current source commonly connected to the comparison transistor pair; and a current feedback transistor pair whose current feedback transistors are connected to comparison transistors of the comparison transistor pair, respectively, and that changes current flowing through the load current source pair based on a signal representative of a result of the comparison by the comparison transistor pair.

5. The fully differential amplification device according to claim 4, wherein the load current source pair comprises a load current source transistor pair, and one of the current feedback transistors of the current feedback transistor pair and load current source transistors of the load current source transistor pair constitute a current mirror circuit.

6. The fully differential amplification device according to claim 2, wherein the differential transistor pair comprises a MOS transistor pair.

7. The fully differential amplification device according to claim 2, wherein the differential transistor pair comprises a bipolar transistor pair.

8. The fully differential amplification device according to claim 3, wherein the output common voltage generation circuit has a buffer pair comprising bipolar transistors between the output terminals of the output inversion amplification transistor pair and the series circuit of the first and second resistors.

* * * * *